United States Patent [19]
Belot et al.

[11] Patent Number: 5,734,272
[45] Date of Patent: Mar. 31, 1998

[54] DIFFERENTIAL STAGE LOGIC CIRCUIT

[75] Inventors: Didier Belot, Rives; Laurent Dugoujon, Saint Bernard Du Touvet, both of France

[73] Assignee: SGS-Thomson Microelectronics S.A., Saint Genis, France

[21] Appl. No.: 611,426

[22] Filed: Mar. 6, 1996

[30] Foreign Application Priority Data

Mar. 7, 1995 [FR] France .................... 95 02840

[51] Int. Cl.[6] ............. H03K 19/082; H03K 19/0948; H03K 19/013

[52] U.S. Cl. ............. 326/126; 326/18; 326/84; 326/110; 327/65; 327/544

[58] Field of Search ............. 326/126–127, 326/109–110, 48–50, 18, 84–85; 327/65–67, 72, 544

[56] References Cited

U.S. PATENT DOCUMENTS

| | | | |
|---|---|---|---|
| 4,713,560 | 12/1987 | Herndon | 307/455 |
| 4,791,326 | 12/1988 | Vaidic et al. | 307/571 |
| 4,999,519 | 3/1991 | Kitsukawa et al. | 326/110 |
| 5,179,358 | 1/1993 | Martin | 331/1 A |
| 5,283,479 | 2/1994 | Rosseel et al. | 326/126 |
| 5,306,964 | 4/1994 | Taylor | 326/110 |
| 5,334,891 | 8/1994 | Marbot | 327/281 |
| 5,463,343 | 10/1995 | Marbot | 327/270 |

FOREIGN PATENT DOCUMENTS

A-0 544 362  6/1993  European Pat. Off. .

*Primary Examiner*—Edward P. Westin
*Assistant Examiner*—Jon Santamauro
*Attorney, Agent, or Firm*—Wolf, Greenfield & Sacks, P.C.; James H. Morris

[57] ABSTRACT

An ECL stage has its current consumption adapted to its operation speed. For this purpose, the load resistor and the bias current source are adjustable so that the product of the current value of the source by the resistor value is substantially constant.

4 Claims, 3 Drawing Sheets

5,734,272

DIFFERENTIAL STAGE LOGIC CIRCUIT

BACKGROUND OF THE INVENTION

1. Field of the Invention

The present invention relates to logic circuits comprising differential stages operating in linear mode, in particular differential amplifier stages, such as emitter-coupled logic (ECL) circuits, source-coupled logic (SCL) circuits or more generally coupled-mode logic (CML) circuits.

2. Discussion of the Related Art

ECL circuits are among the fastest circuits. To obtain a high operation speed, these circuits are designed so that their bipolar transistors never saturate.

To prevent transistors from saturating, they are connected in differential stages, that is why the terminology "coupled emitters" is used. Thus, the signals processed by ECL circuits are mostly differential signals, and each differential component is applied to the respective input of a differential stage.

FIG. 1 represents a differential stage with bipolar transistors (Ta, Tb) which can be used as an ECL inverter. The collectors of transistors Ta and Tb are connected to a high voltage Vcc through respective load resistors R and a bias current source I is connected between ground GND and the emitters of transistors Ta and Tb. The differential input A–A* of the amplifier is formed by the two bases of transistors Ta and Tb. The differential output V is taken as a voltage between the collectors of transistors Ta and Tb.

ECL signals have a low excursion, i.e., the voltage difference between the high state and the low state of a component of an ECL signal is low. This low excursion (approximately 0.5 volt) improves the speed of the logic circuit by reducing the charge and discharge energy of spurious capacitances.

The speed of the logic circuits is mainly limited by the spurious capacitances of the bipolar transistors. The collector circuit of a bipolar transistor has a time constant inversely proportional to the collector current. Therefore, to increase the speed, high currents should be used. The collector resistors have then a low value to limit the excursion of the ECL signals to a desired value. Thus, a main drawback of ECL circuits is their high power consumption due to the fact that these high currents, provided by current sources, are always consumed by one of the branches of a differential stage.

Some ECL circuits are designed to operate at various frequencies, for example in some ATM (Asynchronous Transmission Mode) circuits, they operate at speeds of 155 and 622 Megabits per second (ITU-I-432 standard).

A circuit designed to operate at the highest possible speed has, because of the above-mentioned reasons, a high power consumption which is unjustified at low speed.

A conventional approach to limit the consumption at low speeds is to adjust the currents provided by the sources to the transmission speeds. To maintain the same voltage excursion, the load resistors are replaced with diodes. Thus, a steady excursion of approximately 0.7 volt is maintained for various currents. However, this excursion is not compatible with standard ECL technology, and highly depends on temperature. In addition, the presence of diodes increases the spurious capacitances.

PCT application WO-A-93/18587 describes an ECL stage whose consumption is adjustable as a function of the operating frequency by adjusting the bias current and the loads of the stage in such a way that the excursion remains constant over the operating frequency range. However, the circuitry for performing the adjustments is complex. For example, an adjustment signal would be a digital signal provided by a microprocessor. This digital signal would need a digital to analog conversion before it can act on the bias current or on the loads.

SUMMARY OF THE INVENTION

An object of the present invention is to provide a logic circuit with a differential stage whose current consumption may be adjusted to the operation frequency in a particularly simple manner, while ensuring a steady excursion, compatible with ECL technologies.

To achieve this object, the present invention provides an amplifier stage including at least one MOS load transistor as an adjustable load, an adjustable bias current source, and adjusting means for increasing the bias current with an increase of the operating frequency of the amplifier stage and for controlling the load transistor such that the product of the bias current by the resistance of the load transistor is constant. The adjusting means comprise a diode connected MOS transistor forming a current mirror with the load transistor; a plurality of constant control current sources, selectable independently by respective selection signals for biasing the diode connected transistor; and a plurality of constant bias current sources forming said adjustable bias current source, each constant bias current source being selectable by a respective one of said selection signals for biasing the amplifier stage.

According to an embodiment of the invention, the constant bias current source and the control current source associated to a same selection signal are two outputs of a same current mirror having a predetermined input current that is switched on or off by the associated selection signal.

According to an embodiment of the invention, the amplifier stage includes two transistors connected as a differential stage whose quiescent current is set by said adjustable bias current source, each transistor of the differential stage being associated with one load transistor.

According to an embodiment of the invention, all constant bias current sources and control current sources associated to a same selection signal are outputs of a same current mirror having a predetermined input current that is switched on or off by the associated selection signal.

BRIEF DESCRIPTION OF DRAWINGS

The foregoing and other objects, features, aspects and advantages of the invention will become apparent from the following detailed description of an illustrative embodiment the present invention when taken in conjunction with the accompanying drawings, of which.

DETAILED DESCRIPTION

Figure 1:
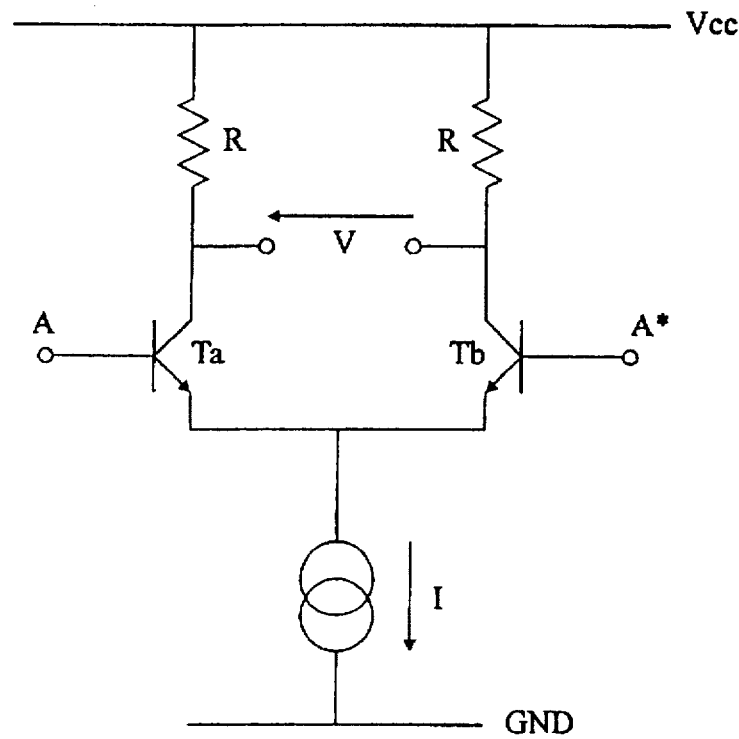
FIG. 1 above described, represents a conventional differential amplifier stage.
Figure 2:
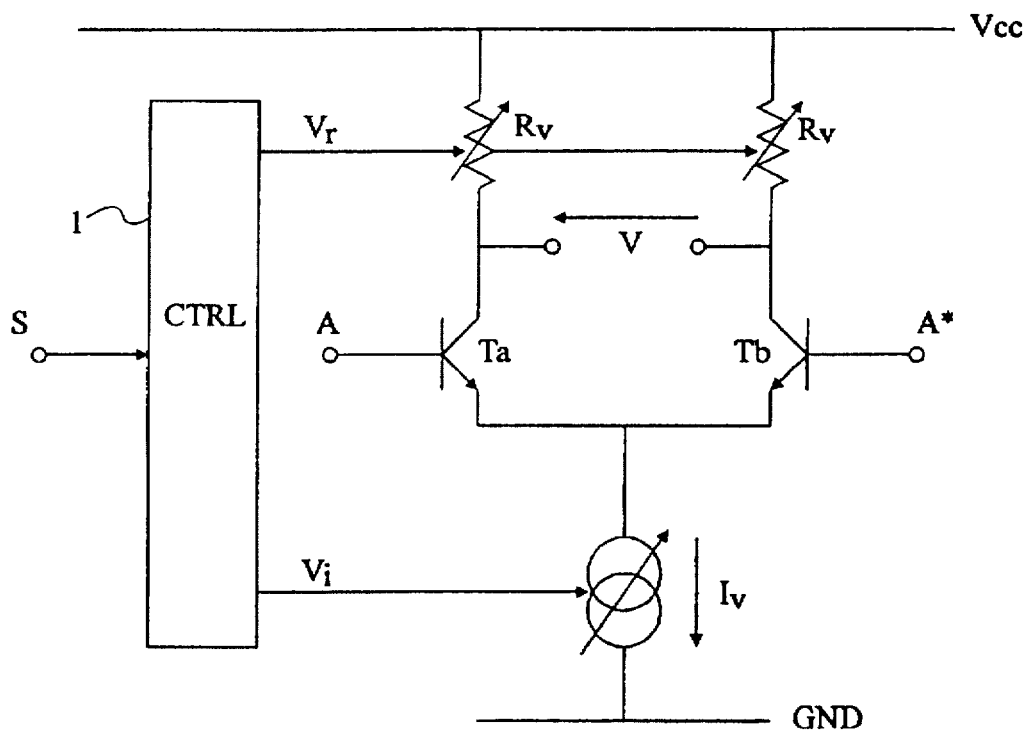
FIG. 2 is a schematic of a differential amplifier stage with an adjustable consumption.

In FIG. 2, the same elements as those represented in FIG. 1 are designated with the same reference characters. A bias current source $I_v$ and the load resistors $R_v$ are adjustable and controlled by respective control signals $V_i$ and $V_r$, provided by a control circuit 1, in turn controlled by a selection signal S.

For each operation frequency, a minimum bias current $I_v$ is determined which enables a suitable operation of the circuit at this frequency. Each bias current $I_v$ is determined by a value of signal S, which is, according to the invention, a digital signal provided on a plurality of signal lines. The control circuit 1 applies signals $V_i$ and $V_r$ as a function of signal S, so that the value of the corresponding resistor $R_v$ is inversely proportional to the value of the current $I_v$. Thus, the excursion of the output voltage $\Delta V=R_v \cdot I_v$ remains constant for any value of $I_v$.

Figure 3:
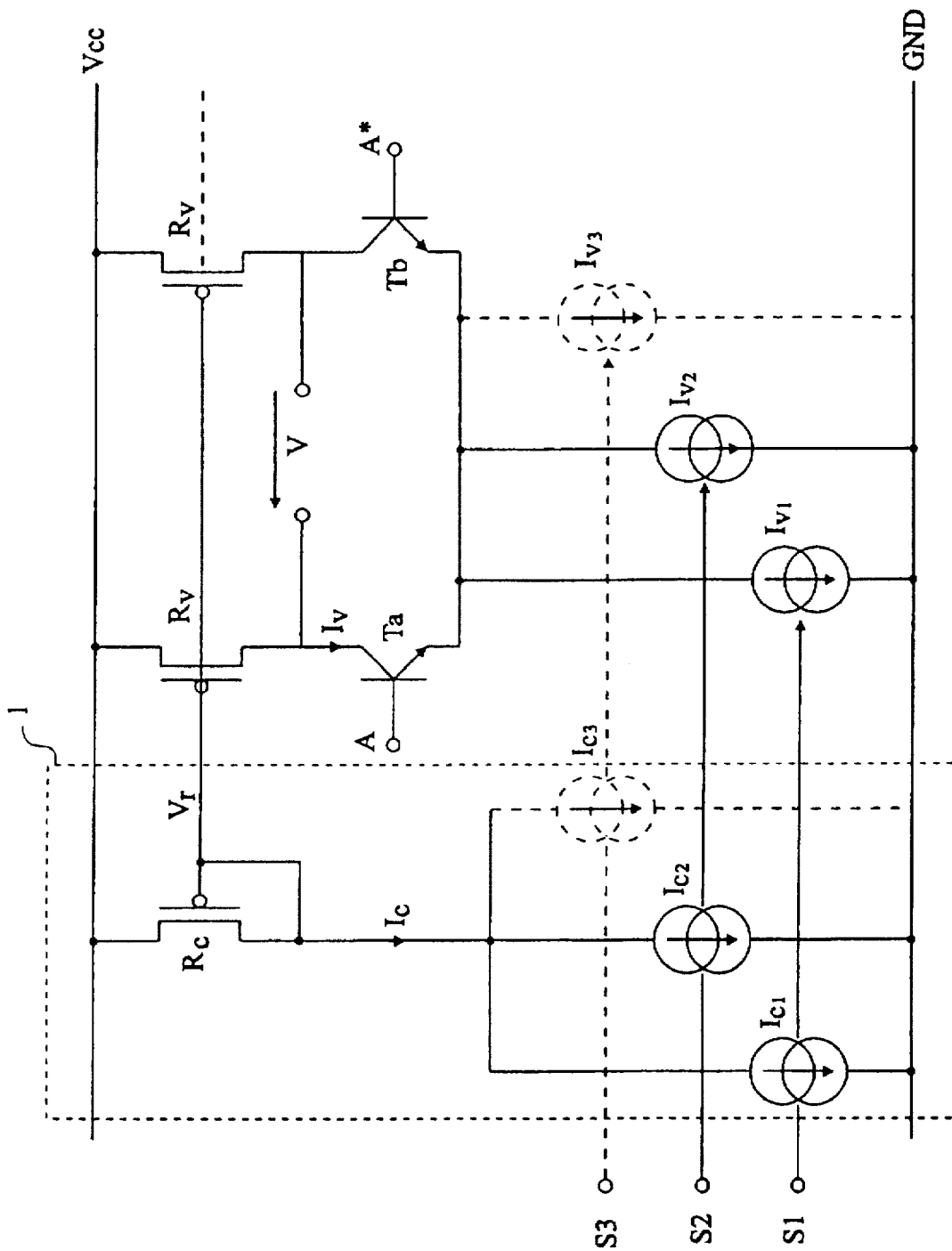
FIG. 3 represents the circuit of FIG. 2 in more detail and incorporating an embodiment of adjustment circuitry according to the invention.

FIG. 3 represents an exemplary embodiment of the adjustable resistors $R_v$, of the adjustable current source $I_v$ and of their control circuit 1 according to the invention.

Each load resistor $R_v$ is formed by a P-channel MOS transistor operating in linear mode, i.e., as a voltage-controlled resistor.

According to the invention, the bias current source $I_v$ includes a plurality of switchable current sources $I_{v1}$, $I_{v2}$, $I_{v3}$ .... connected in parallel. Each source $I_{vi}$ (i=1, 2, ...) is adapted to one of the desired operation frequencies of the circuit and is selected by an associated selection signal $S_i$.

An embodiment of control circuit 1 according to the invention includes a P-channel MOS transistor $R_c$ connected as a diode, i.e., with interconnected drain and gate. The source of transistor $R_c$ is connected to the high voltage Vcc and its drain is connected to ground GND through switchable control current sources $I_{c1}$, $I_{c2}$, $I_{c3}$ ...., connected in parallel, associated with sources $I_{v1}$, $I_{v2}$, $I_{v3}$ ...., respectively, and selected by identical signals S1, S2, S3, .... The drain of MOS transistor $R_c$ provides the control voltage $V_r$ to the gates of transistors $R_v$. Thus, to each value of the bias current $I_v$, selected by a signal $S_i$, corresponds a value of voltage $V_r$, determined by the control current $I_c$ that is selected by the same signal $S_i$. Transistor $R_c$ operates in saturation mode. The voltage $V_r$ which appears between its drain and its source is such that:

$$I_c = K_c \cdot W_c / L_c \cdot (V_r - V_{tc})^2 \qquad (1)$$

where:

K is the slope coefficient of the P-channel MOS transistor, W/L is a size factor of the transistor, and Vt is the pinch-off voltage of the transistor. Indexes c indicate that these parameters correspond to a transistor $R_c$.

Voltage $V_r$ is applied between the gate and the source of transistors $R_v$. It is assumed, in the following explanations, that current $I_v$ flows through only one transistor $R_v$. The voltage which appears between the drain and the source of transistor $R_v$, operating in linear mode, is the excursion $\Delta V$, which is such that:

$$I_v = 2 \cdot K_v \cdot W_v / L_v \cdot [\Delta V \cdot (V_r - V_t - \Delta V/2)]. \qquad (2)$$

Parameters K, W, L and $V_t$ are those defined with relation to equation (1). Indexes v indicate that these parameters correspond to a transistor $R_v$.

Using equations (1) and (2) to find the relationship between excursion $\Delta V$ and currents $I_c$ and $I_v$, the following is obtained:

$$I_c = \frac{K_c W_c}{L_c} \left( \frac{I_v}{2 K_v W_v} \cdot \frac{1}{\Delta V} + \frac{\Delta V}{2} \right)^2 \qquad (3)$$

Equation (3) provides each value of the control current $I_c$ as a function of the desired excursion $\Delta V$ and of each selected bias current $I_v$.

It should be noted that the control stage ($R_c$, $I_{c1}$, $I_{c2}$, $I_{c3}$, ...) may be common to a plurality of amplifier stages of a logic circuit.

Figure 4:
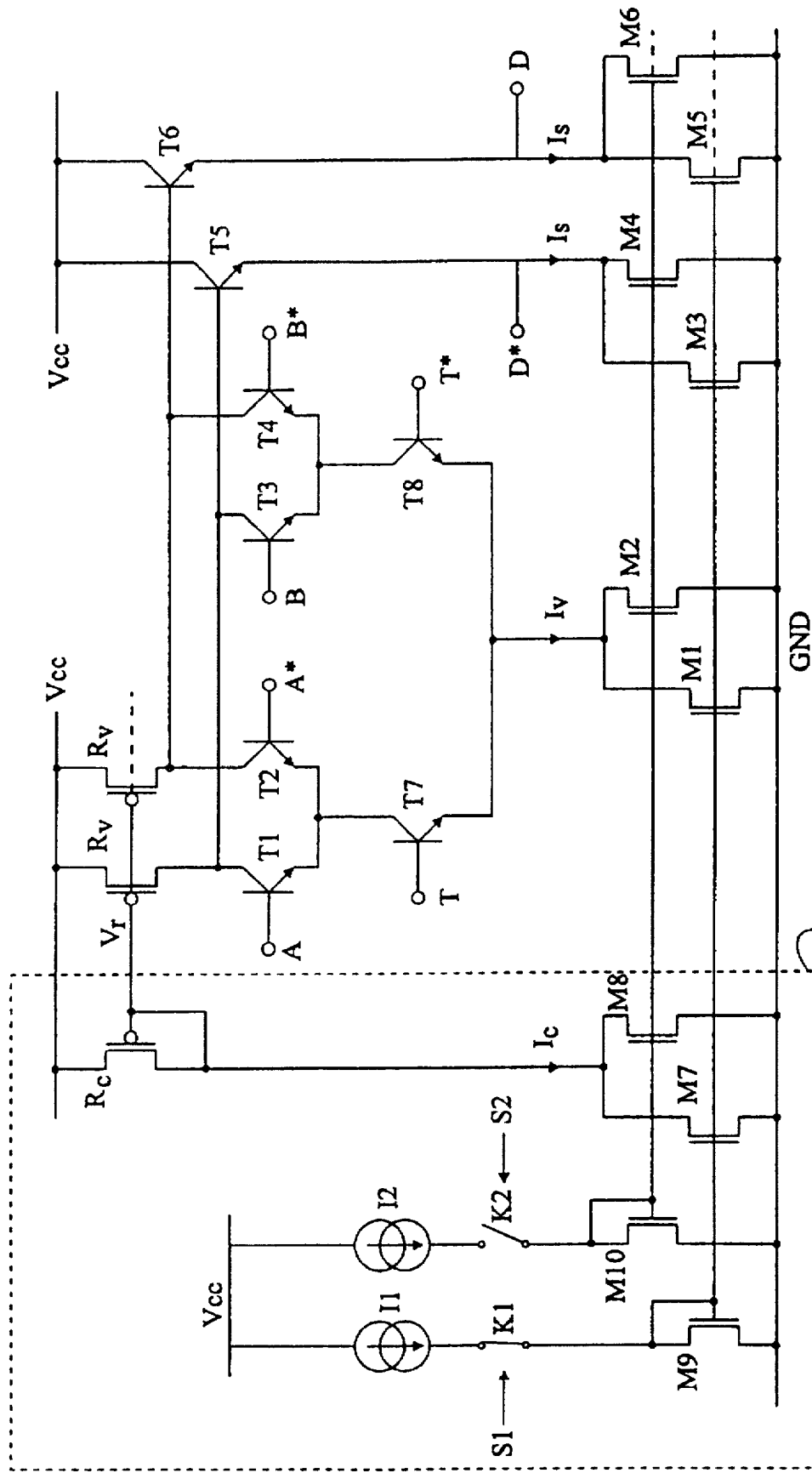
FIG. 4 represents an example of a multiplexer with adjustable consumption differential amplifier stages, incorporating another embodiment of adjustment circuitry according to the invention.

FIG. 4 represents an exemplary embodiment of a multiplexer logic circuit using another example of resistors and adjustable bias currents according to the invention.

The circuit of FIG. 4 routes one of the differential signals A–A* and B–B*, depending upon the state of a differential control signal T–T*, to a differential output D–D*. The circuit conventionally includes three differential stages arranged in two levels followed by two follower stages for providing the output signal D–D*.

The two differential stages of the first level are formed by bipolar transistors T1–T4, loaded by two P-channel MOS transistors $R_v$, used as variable resistors. The drain of the first transistor $R_v$ is connected to the base of a follower bipolar transistor T5 and to the collectors of the bipolar transistors T1 and T3. The collector of transistor T5 is connected to the supply voltage Vcc and its emitter constitutes the output D*. The bases of transistors T1 and T3 constitute the input terminals A and B. Similarly, the drain of the second transistor $R_v$ is connected to the base of a follower bipolar transistor T5 and to the collectors of the bipolar transistors T2 and T4 whose bases constitute the respective input terminals A* and B*. The collector of transistor T6 is connected to the voltage Vcc and its emitter constitutes the output D.

The emitters of transistors T1 and T2 are connected to the collector of a bipolar transistor T7 whose base constitutes the input terminal T. Similarly, the emitters of transistors T3 and T4 are connected to the collector of a bipolar transistor T8 whose base constitutes the input terminal T*. A bias current $I_v$ is distributed among the emitters of transistors T7 and T8. The current $I_v$ is generated by a variable current source formed by two N-channel MOS transistors M1 and M2 having their sources connected to ground GND and their drains connected to the junction of the emitters of transistors T7 and T8.

As represented in FIG. 4, the follower transistors T5 and T6 can be biased by a current $I_s$ varying like the current $I_v$, in these cases where this additional complexity is compensated by the power spared.

The current $I_s$ for biasing the follower transistor T5 is provided by a current source including two N-channel MOS transistors M3 and M4, having their sources connected to ground GND and their drains connected to the emitter of transistor T5. The current $I_s$ for biasing the follower transistor T6 is provided by a current source including two N-channel MOS transistors, M5 and M6, connected to transistor T6 in the same way as transistors M3 and M4 are connected to transistor T5.

In control circuit 1, a P-channel MOS transistor $R_c$ biased by a current $I_c$ is connected in the same way as the transistor $R_c$ of FIG. 3. The control voltage $V_r$ is applied to the gates of the two transistors $R_v$, and optionally to additional similar transistors associated with other differential stages. The source of the control current $I_c$ includes two N-channel MOS transistors M7 and M8, having their sources connected to ground GND and their drains connected to the drain of transistor $R_c$.

Transistors M7, M1, M3 and M5, operating in saturation mode, are output transistors of a current mirror whose input transistor is an N-channel MOS transistor M9, connected as a diode and connected to ground GND. A current source I1 supplies transistor M9 and the gates of transistors M9, M7, M1, M3 and M5 through a switch K1, which is controlled by a selection signal S1.

Transistors M8, M2, M4 and M6, operating in saturation mode, are output transistors of a current mirror whose input transistor is an N-channel MOS transistor M10, connected as a diode and connected to ground GND. A current source I2 supplies transistor M10 and the gates of transistors M10, M8, M2, M4 and M6 through a switch K2, which is controlled by a selection signal S2.

If the selection signal S1 is active, the switch K1 is switched on and the current source I1 biases the transistor M9. Transistors M7, M1, M3, M5 and optionally additional similar transistors associated with other differential stages then mirror at their drains the current I1 with multiplication coefficients determined by the surface ratios between transistors M7, M1, M3, M5 and transistor M9. Similarly, if signal S2 is active, it is transistors M8, M2, M4, M6, and possibly similar additional transistors, that mirror at their drains the current I2 with other suitable multiplication coefficients.

By suitably selecting the ratio of currents I1 and I2 and/or the multiplication coefficients, the bias currents $I_v$, $I_s$ and the control current $I_c$ can have two series of values, such that the excursion of the output voltage D–D* remains constant.

Each of these series, determined by the selection of either one of sources I1 and I2, is determined so that the power consumption is minimum at the associated operation frequency.

Having thus described at least one illustrative embodiment of the invention, various alterations, modifications and improvements will readily occur to those skilled in the art. Such alterations, modifications, and improvements are intended to be within the spirit and scope of the invention. Accordingly, the foregoing description is by way of example only and is not intended to be limiting. The invention is limited only as defined in the following claims and the equivalents thereto.

We claim:

1. An amplifier stage including at least one MOS load transistor as an adjustable load ($R_v$), an adjustable bias current source ($I_v$), and adjusting means (1) for increasing the bias current with an increase of the operating frequency of the amplifier stage and for controlling the load transistor such that the product of the bias current by the resistance of the load transistor is constant, wherein said adjusting means comprise:

a diode connected MOS transistor ($R_c$) forming a current mirror with said load transistor;

a plurality of constant control current sources ($I_c$), selectable independently by respective selection signals (S) for biasing the diode connected transistor; and a plurality of constant bias current sources ($I_v$) forming said adjustable bias current source, each constant bias current source being selectable by a respective one of said selection signals for biasing the amplifier stage.

2. The amplifier stage of claim 1, wherein the constant bias current source ($I_v$) and the control current source ($I_c$) associated to a same selection signal are two outputs of a same current mirror having a predetermined input current that is switched on or off by the associated selection signal.

3. The amplifier stage of claim 1, including two transistors (Ta, Tb) connected as a differential stage whose quiescent current is set by said adjustable bias current source ($I_v$), each transistor of the differential stage being associated with one load transistor ($R_v$).

4. A logic circuit including a plurality of amplifier stages according to claim 1, wherein all constant bias current sources and control current sources associated to a same selection signal are outputs of a same current mirror having a predetermined input current that is switched on or off by the associated selection signal.

* * * * *